US009818780B2

(12) United States Patent
Miyazaki et al.

(10) Patent No.: US 9,818,780 B2
(45) Date of Patent: Nov. 14, 2017

(54) CAMERA MODULE

(71) Applicant: TAIYO YUDEN CO., LTD., Tokyo (JP)

(72) Inventors: Masashi Miyazaki, Tokyo (JP); Yuichi Sugiyama, Tokyo (JP); Tatsuro Sawatari, Tokyo (JP); Hideki Yokota, Tokyo (JP); Yutaka Hata, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 14/155,308

(22) Filed: Jan. 14, 2014

(65) Prior Publication Data

US 2014/0252522 A1     Sep. 11, 2014

(30) Foreign Application Priority Data

Mar. 5, 2013  (JP) .................................. 2013-43085

(51) Int. Cl.
*H01L 27/146*        (2006.01)

(52) U.S. Cl.
CPC ...... *H01L 27/14627* (2013.01); *H01L 27/146* (2013.01); *H01L 27/14605* (2013.01); *H01L 27/14618* (2013.01); *H01L 27/14625* (2013.01); *H01L 27/14636* (2013.01); *H01L 2224/48091* (2013.01); *H01L 2224/48227* (2013.01); *H01L 2924/15192* (2013.01); *H01L 2924/19105* (2013.01)

(58) Field of Classification Search
CPC .................................................... H01L 27/146
USPC .......................................... 257/432; 438/106
See application file for complete search history.

(56) References Cited

U.S. PATENT DOCUMENTS

| 2007/0204243 | A1* | 8/2007 | Ito et al. ........................... 716/4 |
| 2008/0164550 | A1* | 7/2008 | Chen ................. H01L 27/14618 257/432 |
| 2011/0051390 | A1* | 3/2011 | Lin ................... H01L 27/14618 361/818 |
| 2011/0169118 | A1* | 7/2011 | Sano ................. H01L 27/14618 257/432 |
| 2011/0304003 | A1* | 12/2011 | Tanida et al. ................. 257/447 |
| 2012/0086092 | A1* | 4/2012 | Yanagita ........... H01L 27/14636 257/432 |
| 2014/0184809 | A1* | 7/2014 | Luan ................. H01L 27/14618 348/164 |

(Continued)

FOREIGN PATENT DOCUMENTS

| JP | 2007-150101 A | 6/2007 |
| JP | 2011-035458 A | 2/2011 |
| JP | 2011-147182 A | 7/2011 |

(Continued)

OTHER PUBLICATIONS

Japanese Office Action dated Dec. 5, 2014, in a counterpart Japanese patent application No. 2013-043085.

*Primary Examiner* — Thao X Le
*Assistant Examiner* — Xia Cross
(74) *Attorney, Agent, or Firm* — Chen Yoshimura LLP

(57) ABSTRACT

In a camera module, a planar part, which is for mitigating deformation of the surface of a second insulating portion on which an imaging device is mounted, is embedded in the second insulating portion of a substrate so as to face the imaging device mounted on the surface (top surface) of the second insulating portion.

14 Claims, 12 Drawing Sheets

(56) References Cited

U.S. PATENT DOCUMENTS

2014/0339668 A1* 11/2014 Arima ................ H01L 23/4006
                                                                                                        257/443
2015/0028187 A1* 1/2015 Jin ..................... H01L 27/14625
                                                                                                        250/208.1

FOREIGN PATENT DOCUMENTS

| JP | 2014-82682 A | 5/2014 |
| WO | 2011/080952 A1 | 7/2011 |

* cited by examiner

CAMERA MODULE

This application claims the benefit of Japanese Application No. 2013-43085, filed in Japan on Mar. 5, 2013, which is hereby incorporated by reference in its entirety.

BACKGROUND OF THE INVENTION

Field of the Invention

The present invention relates to a camera module with an imaging device mounted on an insulating portion of a substrate.

Description of Related Art

Camera modules used in mobile devices such as mobile phones and smartphones have an imaging device mounted on an insulating portion of a substrate and lenses arranged above this imaging device (see Patent Document 1 below).

Such a camera module has the imaging device mounted on the insulating portion of the substrate; therefore, when stress following a shock from being dropped, heated, or the like is exerted on the camera module substrate in the mobile device, especially if exerted on the insulating portion on which the imaging device is mounted, then deformations such as deflection and buckling of the surface of the insulating portion to which the imaging device is mounted may occur. These deformations may cause a shift in the optical axis with respect to the imaging device and lenses, leading to functional failures such as image deviation or image distortion, for example.

RELATED ART DOCUMENT

Patent Document

Patent Document 1: Japanese Patent Application Laid-Open Publication No. 2011-035458

SUMMARY OF THE INVENTION

The present invention aims at providing a camera module in which functional failures caused by deformation of the surface of an insulating portion on which an imaging device is mounted can be avoided to the fullest extent possible.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present invention is a camera module that includes: an imaging device mounted on an insulating portion of a substrate; and a lens arranged above the imaging device, wherein a planar part is embedded in the insulating portion of the substrate so as to face the imaging device, the planar part mitigating deformation of a surface of the insulating portion on which the imaging device is mounted.

According to the present invention, a camera module can be provided in which functional failures caused by deformation of the surface of an insulating portion on which an imaging device is mounted can be avoided to the fullest extent possible.

The above-mentioned goal and other goals of the present invention, features, and effects according to these respective goals shall be made clear by the explanation below and the accompanying drawings.

It is to be understood that both the foregoing general description and the following detailed description are exemplary and explanatory, and are intended to provide further explanation of the invention as claimed.

DETAILED DESCRIPTION OF THE PREFERRED EMBODIMENTS

Embodiment 1 (FIGS. 1 to 4)

Figure 1:
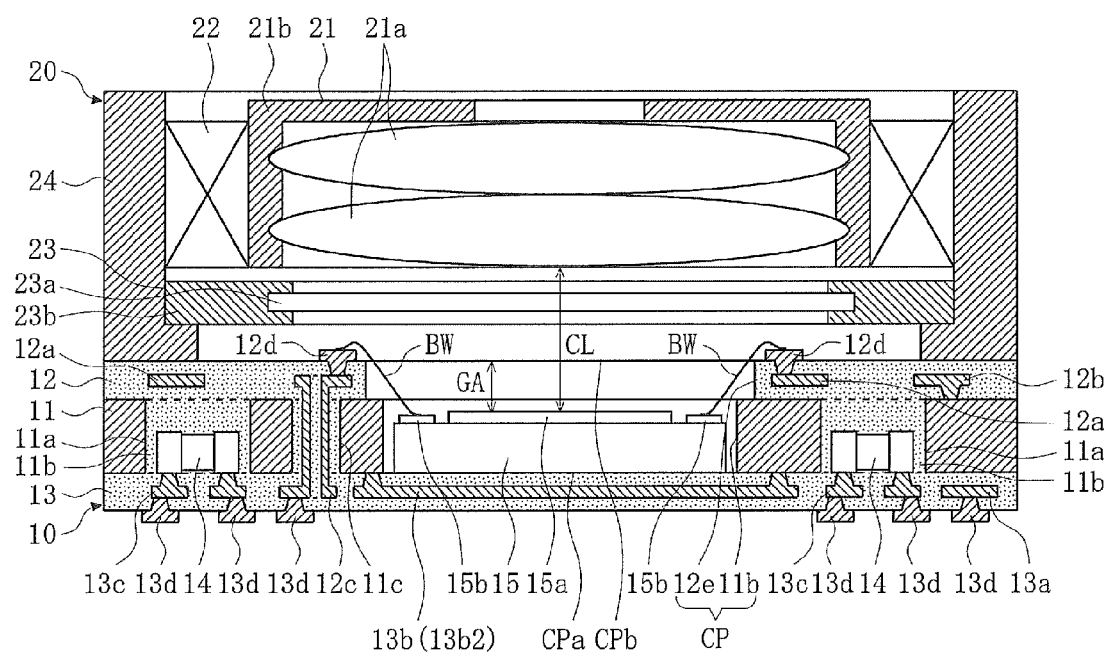
FIG. 1 is a vertical cross-sectional view showing a camera module according to Embodiment 1 of the present invention.

(Configuration of Camera Module in FIG. 1)

A camera module shown in FIG. 1 is provided with various devices and circuits for performing camera functions, and is constituted of a substrate 10 and an optical package 20 attached thereto. The camera module is substantially cuboid-shaped as a whole. For reference, a size example of the camera module shown in FIG. 1 has a length and width (the horizontal direction in FIG. 1) of approximately 8.5 mm, and a height (the vertical direction in FIG. 1) of approximately 5 mm.

As shown in FIG. 1, the substrate 10 is provided with: a core portion 11 that has electronic components 14 embedded therein and that also acts as ground wiring; a first insulating portion 12 that is disposed on a surface (top surface) in the thickness direction of the core portion 11 and in which signal wiring 12a, ground wiring 12b, and the like are embedded; and a second insulating portion 13 that is disposed on another surface (bottom surface) in the thickness direction of the core portion 11 and in which signal wiring 13a, ground wiring 13b, and the like are embedded. In other words, the substrate 10 is a multilayer structure substrate with the electronic components 14 embedded therein.

Through-holes 11a for housing components, through-holes 11b that form a portion of a recessed portion CP, and a through-hole 11c for arranging a conductor via are formed in the core portion 11. The electronic components 14 such as a capacitor, inductor, resistor, filter chip, or IC chip are respectively housed suitably in each of the through-holes 11a for housing components, for example, and an insulating material is filled in the gap between the housed electronic component 14 and the through-hole 11a.

The signal wiring 12a and ground wiring 12b, which are two-dimensionally patterned, and conductor vias (not shown) that have a "T" shape in a cross-sectional view are embedded in the first insulating portion 12. The signal wiring 13a and ground wiring 13b, which are two-dimensionally patterned, and conductor vias 13c that have a "T" shape in a cross-sectional view are embedded in the second insulating portion 13. A cylindrical conductor via 12c that reaches from the first insulating portion 12 to the second insulating portion 13 through the through-hole 11c in the core portion 11 is embedded in the first insulating portion 12 and second insulating portion 13. Conductor pads 12d and conductor pads 13d that have a "T" shape in a cross-sectional view are respectively disposed in the surface (top surface) of the first insulating portion 12 and in the surface (bottom surface) of the second insulating portion 13.

Furthermore, a through-hole 12e that forms another portion of the recessed portion CP is formed in the first insulating portion 12 in a location directly above the through-hole 11b in the core portion 11. The cross-sectional area of this through-hole 12e is larger than the cross-sectional area of the through-hole 11b in the core portion 11, and the center line of the through-hole 12e substantially corresponds to the center line of the through-hole 11b. In other words, the recessed portion CP, which includes the through-hole 12e in the first insulating portion 12 and the through-hole 11b in the core portion 11, is provided in the surface (top surface) of the substrate 10. The depth of this recessed portion CP is greater than the thickness of an imaging device 15, and the area of an opening CPb (the opening on the surface of the substrate 10) is larger than the area of a bottom CPa of the recessed portion CP. The inner walls (no reference character) of the recessed portion CP have a step-like cross-sectional shape.

The imaging device 15, such as a CMOS image sensor or CCD image sensor, is mounted on the bottom CPa of the recessed portion CP, or in other words, to the surface (top surface) of the second insulating portion 13, with an adhesive agent. This imaging device 15 has a light-receiving part 15a on the center of the surface (top surface) of the imaging device 15 and a plurality of connection pads 15b on the periphery of the imaging device 15. As described above, the depth of the recessed portion CP is greater than the thickness of the imaging device 15, and thus, an opening GA is present between the surface (top surface) of the imaging device mounted on the bottom CPa of the recessed portion CP and the surface (top surface) of the substrate 10. The connection pads 15b on the imaging device 15 are connected to the conductor pads 12d in the first insulating portion 12 by bonding wires BW that go through the opening GA present between the surface (top surface) of the imaging device 15 and the height of the surface (top surface) of the substrate 10.

The outline of the imaging device 15 is substantially rectangular, and the outline (the cross-section of the through-hole 11b) of the bottom CPa of the recessed portion CP and the outline (the cross-section of the through-hole 12e) of the opening CPb have a substantially rectangular shape that is similar to the outline of the imaging device 15. If the outline (the cross-section of the through-hole 11b) of the bottom CPa of the recessed portion CP is made too large in relation to the outline of the imaging device 15, then the length and width (the horizontal direction in FIG. 1) will be needlessly increased, and thus, the outline (the cross-section of the through-hole 11b) of the bottom CPa is the smallest size that permits insertion of the imaging device 15.

Based on FIG. 1, the core portion 11 is made of a conductive material such as copper or a copper alloy, and the thickness of the core portion 11 is in the range of 100 to 400 µm, for example. The insulating material, the first insulating portion 12, and the second insulating portion 13 are made of an epoxy resin, a polyimide, a bismaleimide-triazine resin, or a compound resin (possible to use a thermoplastic material in addition to a thermosetting material) such as a material that includes a reinforced filler made of silicon dioxide or the like in the above. The thickness of the first insulating portion 12 and second insulating portion 13 is in the range of 30 to 90 µm, for example. The signal wiring 12a and 13a, the ground wiring 12b and 13b, the conductor vias (not shown) and the conductor vias 12c and 13c, and the conductor pads 12d and 13d are made of a conductive material such as copper or a copper alloy, and the thickness of the signal wiring 12a and 13a and the ground wiring 12b and 13b is in the range of 5 to 25 µm, for example.

The conductor pad 12d in the left side of the first insulating portion 12 is connected to the third conductor pad 13d from the left in the second insulating portion 13 through the conductor via 12c. The conductor pad 12d in the right side of the first insulating portion 12 is connected to the signal wiring 12a in the first insulating portion 12, and the ground wiring 12b in the first insulating portion 12 is connected to the core portion 11 through the via part of the ground wiring 12b (no reference character). The first and second conductor pads 13d from the left in the second insulating portion 13 are respectively connected to terminals of the electronic component 14 on the left side through the conductor vias 13c in the second insulating portion 13. The second and third conductor pads 13d from the right are respectively connected to terminals of the electronic component 14 on the right side through the conductor vias 13c in the second insulating portion 13. The first conductor pad 13d from the right is connected to the signal wiring 13a in the second insulating portion 13, and the ground wiring 13b in the second insulating portion 13 is connected to the core portion 11 through via parts 13b3 (see FIG. 2) of the ground wiring 13b.

Figure 2:
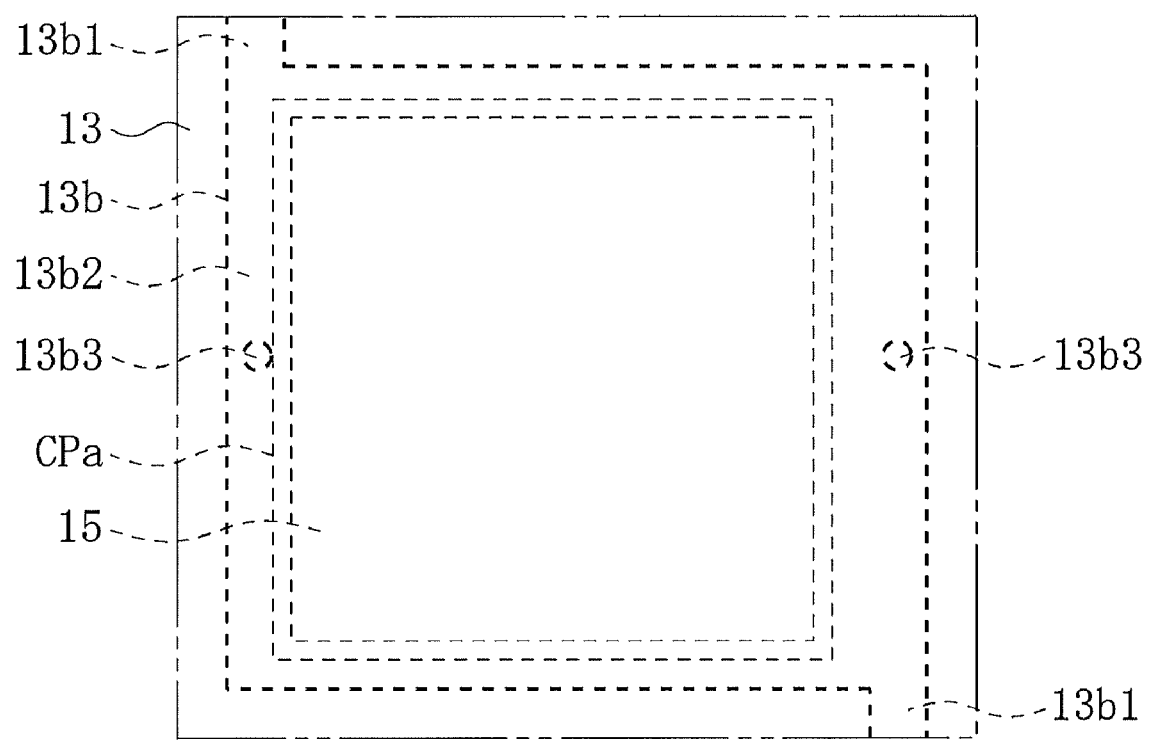
FIG. 2 is a view showing an aspect of a planar part shown in FIG. 1.

The ground wiring 13b embedded in the second insulating portion 13, and in particular an aspect of a planar part 13b2 will be explained with reference to FIG. 2. As shown by the dashed lines in FIG. 2, the ground wiring 13b has the planar part 13b2 present between two wiring parts 13b1, and two of the via parts 13b3 disposed on the planar part 13b2 are connected to the core portion 11. In other words, the planar part 13b2 forms a portion of the ground wiring 13b. The outline of this planar part 13b2 is a substantially rectangular shape that is larger than the outline of the mounting surface (bottom surface) of the imaging device 15 and the outline of the bottom CPa of the recessed portion CP. The planar part 13b2 is substantially parallel to the mounting surface (bottom surface) of the imaging device 15. Based on the size example, the thickness of the planar part 13b2 is the same as the wiring part 13b1 and in the range of 5 to 25 µm, for example, and the distance (depth) with the surface (top surface) of the second insulating portion 13 is in the range of 10 to 30 µm, for example. Due to the planar part 13*b*2 forming a portion of the ground wiring 13*b*, the Young's modulus (a modulus of longitudinal elasticity) of the planar part 13*b*2 is greater than the Young's modulus of the second insulating portion 13 (the portion made of a compound resin). This planar part 13*b*2 functions to mitigate deformation of the surface to which the imaging device 15 is mounted on the second insulating portion 13. FIG. 2 shows two of the via parts 13*b*3, but it is preferable that as many via parts 13*b*3 as possible be disposed on the planar part 13*b*2 and connected to the core portion 11.

As shown in FIG. 1, the optical package is provided with: a lens unit 21; an actuator 22 for auto-focus, arranged around the lens unit 21; a filter unit 23 arranged below the lens unit 21; and a case 24 that includes the lens unit 21, actuator 22, and filter unit 23.

The lens unit 21 has a plurality (2 in the drawing) of lenses 21*a*, and a cylindrical holder 21*b* that surrounds the lenses 21*a*. The actuator 22 for auto-focus is equipped with a movable coil and a fixed permanent magnet, for example. The actuator 22 performs focusing by moving the lens unit 21 in the vertical direction on the basis of driving signals inputted to the movable coil. The filter unit 23 has an optical filter 23*a* such as an IR cut filter, and a looped holder 23*b* that surrounds the optical filter 23*a*. The case 24 has a substantially cuboid-shaped outer appearance, and covers the lens unit 21, actuator 22, and filter unit 23 arranged therein. This case 24 is attached to the substrate 10 by a joining method such as fitting or adhesion such that the lenses 21*a* and optical filter 23*a* are positioned directly above the imaging device 15 of the substrate 10. The case 24 is electrically connected to circuits built on the substrate 10 through terminals (not shown).

(Effects of Camera Module in FIG. 1)

(E11) In the camera module shown in FIG. 1, the planar part 13*b*2, which is for mitigating deformation of the surface of the second insulating portion 13 on which the imaging device 15 is mounted, is embedded in the second insulating portion 13 of the substrate 10 so as to face the imaging device 15 mounted on the surface (top surface) of the second insulating portion 13. Accordingly, even if stress following a shock from being dropped, heated, or the like is exerted on the camera module substrate 10 in a mobile device such as a mobile phone or smartphone, especially if exerted on the surface of the second insulating portion 13 on which the imaging device 15 is mounted, deformations caused by this stress such as deflection and buckling of the surface of the second insulating portion 13 on which the imaging device 15 is mounted are mitigated by the planar part 13*b*2. Thus, deformations causing a shift in the optical axis with respect to the imaging device 15 and lenses 21*a*, and thereby leading to functional failures such as image deviation or image distortion, for example, can be avoided.

(E12) In the camera module shown in FIG. 1, the planar part 13*b*2 is substantially parallel to the mounting surface (bottom surface) of the imaging device 15, and the Young's modulus of the planar part 13*b*2 is greater than the Young's modulus of the second insulating portion 13 (the portion made of a compound resin). Accordingly, a deformation mitigating effect on the surface of the second insulating portion 13 on which the imaging device 15 is mounted is exhibited more precisely, and the functional failures described above can be avoided more reliably.

(E13) In the camera module shown in FIG. 1, the planar part 13*b*2 is made of the same conductive material as the ground wiring 13*b*, and the planar part 13*b*2 forms a portion of the ground wiring 13*b*. Accordingly, forming the planar part 13*b*2 does not incur additional costs because the planar part 13*b*2 can be formed simultaneously when the ground wiring 13*b* is patterned in the second insulating portion 13.

(E14) In the camera module shown in FIG. 1, the recessed portion CP that has a greater depth than the thickness of the imaging device 15 is disposed in the surface (top surface) of the substrate 10, and the imaging device 15 is mounted on the bottom CPa of the recessed portion CP such that the opening GA is present between the surface (top surface) of the imaging device 15 and the height of the surface (top surface) of the substrate 10. Accordingly, even if a gap CL (see FIG. 1) corresponding to the minimum focal distance between the light receiving part 15*a* on the imaging device and the lenses 21*a* must be ensured, the lenses 21*a* can be arranged near the surface (top surface) of the substrate 10, and this can contribute to reducing the height of the camera module and making the camera module thinner.

(Modification Examples of Planar Part)

Figure 3A:
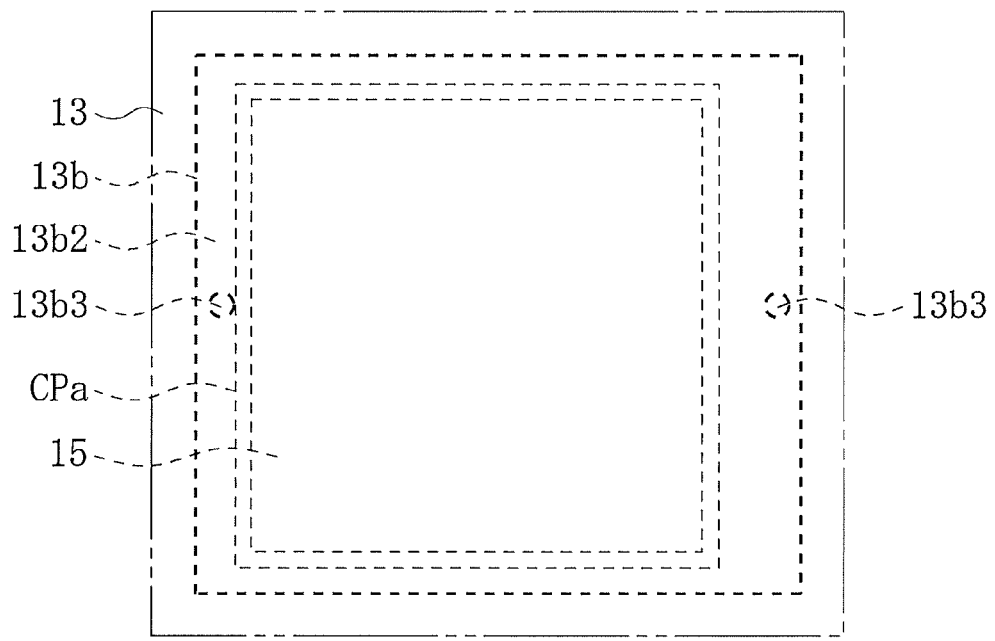
FIG. 3A is a view showing a modification example of the planar part shown in FIG. 1.

(M11) FIG. 2 showed the wiring parts 13*b*1 and via parts 13*b*3 together on the planar part 13*b*2, but as shown in FIG. 3A effects similar to the above-mentioned E11 to E14 can be achieved even if the wiring parts 13*b*1 are removed.

Figure 3B:
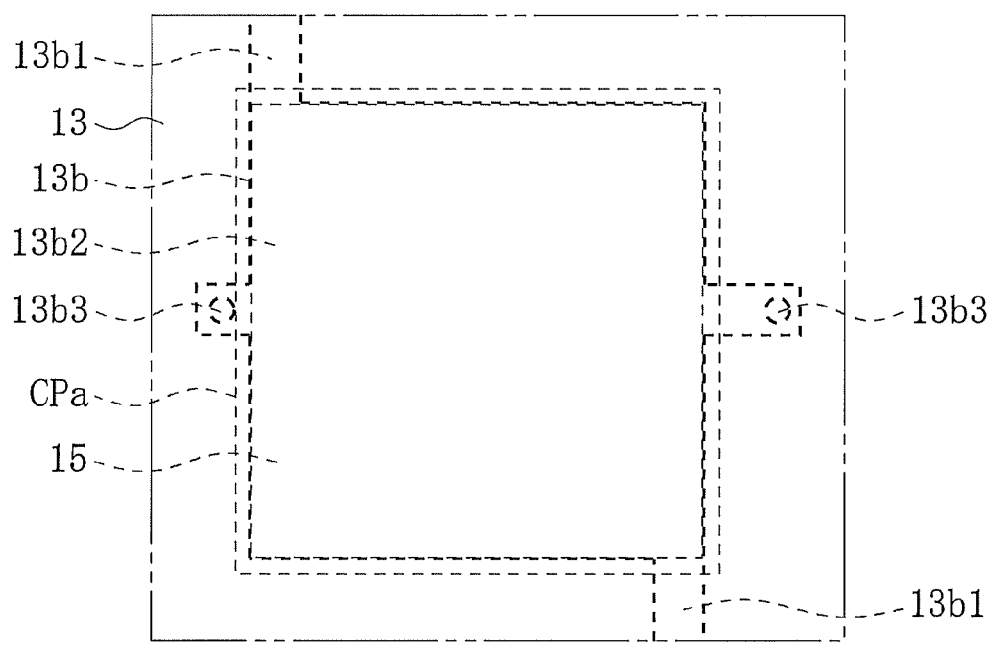
FIG. 3B is a view showing another modification example of the planar part shown in FIG. 1.

(M12) FIG. 2 showed that the outline of the planar part 13*b*2 is larger than the outline of the mounting surface (bottom surface) of the imaging device 15, but as shown in FIG. 3B, effects similar to the above-mentioned E11 to E14 can be achieved even if the outline of the planar part 13*b*2 is substantially equal to the outline of the mounting surface (bottom surface) of the imaging device 15, and even if the outline of the planar part 13*b*2 shown in FIG. 3A is substantially equal to the outline of the mounting surface (bottom surface) of the imaging device 15. Needless to say, effects that are substantially similar to the above-mentioned E11 to E14 can be expected even if the outline of the planar part 13*b*2 is made slightly smaller than the outline of the mounting surface (bottom surface) of the imaging device 15.

Figure 4:
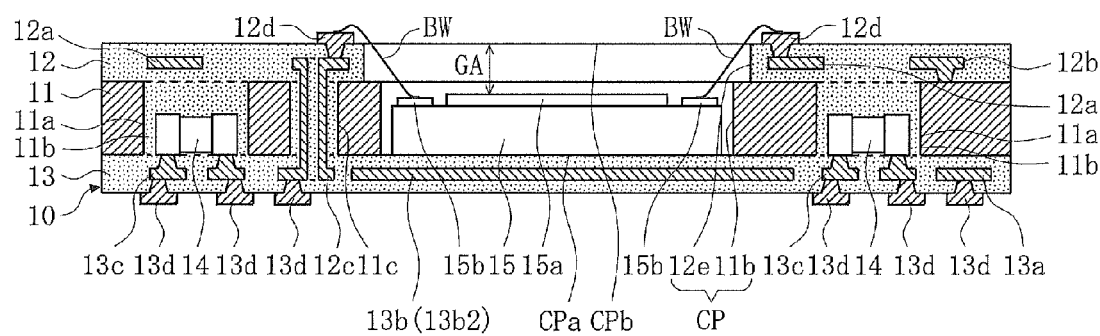
FIG. 4 is a view showing another modification example of the planar part shown in FIG. 1.

(M13) FIG. 2 showed that the planar part 13*b*2 was connected to the core portion 11 through the conductor vias 13*b*3, but as shown in FIG. 4 effects similar to the above-mentioned E11 to E14 can be achieved even if the conductor vias 13*b*3 are removed and even if the conductor vias 13*b*3 and the rectangular protruding portions are removed from the configuration shown in FIG. 3B. When these conductor vias 13*b*3 are removed, effects that are substantially similar to the above-mentioned E11 to E14 can be expected even if the outline of the planar part 13*b*2 is made slightly smaller than the outline of the mounting surface (bottom surface) of the imaging device 15.

(M14) Although such a drawing is omitted, effects similar to the above-mentioned E11 to E14 can be achieved even if just the planar part 13*b*2 in FIG. 2 excluding the wiring parts 13*b*1 and conductor vias 13*b*3 is embedded, or in other words, even if just the planar part 13*b*2 without ground wiring is embedded. In addition, effects similar to the above-mentioned E11 to E14 can be achieved even if the outline of this planar part 13*b*2 is substantially equal to the outline of the mounting surface (bottom surface) of the imaging device 15, or in other words, even if the planar part 13*b*2 is arranged independently in a non-contact state with the ground wiring and the like embedded in the second insulating portion 13. When just this planar part 13*b*2 without ground wiring is embedded, effects that are substantially similar to the above-mentioned E11 to E14 can be expected even if the outline of the planar part 13*b*2 is made slightly smaller than the outline of the mounting surface (bottom surface) of the imaging device 15.

(M15) Although such a drawing is omitted, when just this planar part 13b2 without ground wiring as described in the above-mentioned M14 is embedded, the material of the planar part 13b2 does not necessarily need to be conductive. Effects similar to the above-mentioned E11 to E14 can be achieved even if an equivalent planar part made of a non-conductive material such as ceramic or glass that has a greater Young's modulus than the Young's modulus of the second insulating portion 13 (the compound resin portion) is embedded in the second insulating portion 13, for example.

(M16) Although such a drawing is omitted, as long as deformation of the surface of the second insulating portion 13 on which the imaging device 15 is mounted can be mitigated, similar effects to the above-mentioned E11 to E14 can be achieved even if the planar part 13b2 shown in FIG. 2 and the planar part 13b2 described in the above-mentioned M11 to M15 have slits for passing signal wiring therethrough or though-holes for arranging conductor vias.

Other Modification Examples

In FIGS. 1 and 4, a configuration in which the core portion 11 of the substrate 10 is made of a conductive material was shown, but similar effects to the above-mentioned E11 to E14 can be achieved even if a configuration in which the core portion 11 is made of a non-conductive material such as a compound resin or ceramic is used, for example. Similar effects to the above-mentioned E11 to E14 can be achieved even if the core portion 11 and insulating material are made of a single layer-like insulating material, or in other words, even with a substrate structure in which the electronic components 14 are embedded in a single layer-like insulating material.

Embodiment 2 (FIGS. 5 to 8)

Figure 5:
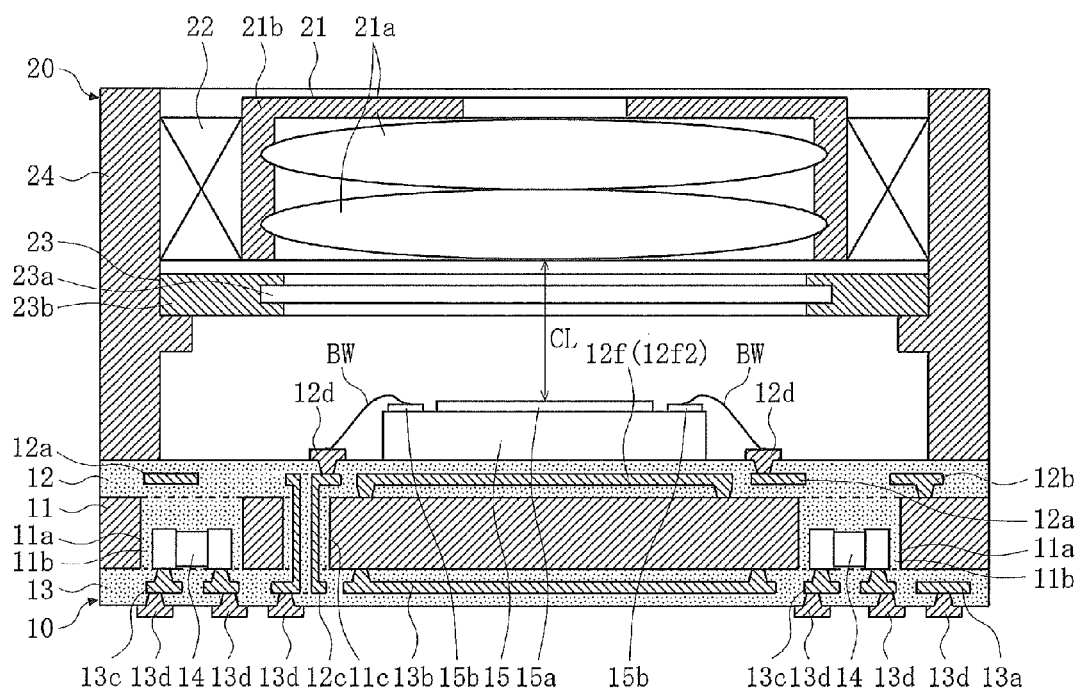
FIG. 5 is a vertical cross-sectional view showing a camera module according to Embodiment 2 of the present invention.

(Configuration of Camera Module in FIG. 5)

A camera module shown in FIG. 5 differs from the camera module of Embodiment 1 shown in FIG. 1 in that: a recessed portion CP has been removed from a substrate 10; an imaging device 15 is mounted on the surface (top surface) of a first insulating portion 12 on the substrate 10; and ground wiring 12f has been embedded in the first insulating portion 12 as a replacement for the ground wiring 13b shown in FIG. 1. In FIG. 5, for convenience of illustration, a configuration is shown in which electronic components 14 are not embedded in the center of a core portion 11, but in reality there are other electronic components 14 also embedded in this center. For reference, a size example of the camera module shown in FIG. 5 has a length and width (the horizontal direction in FIG. 5) of approximately 8.5 mm, and a height (the vertical direction in FIG. 5) of approximately 7 mm.

Figure 6:
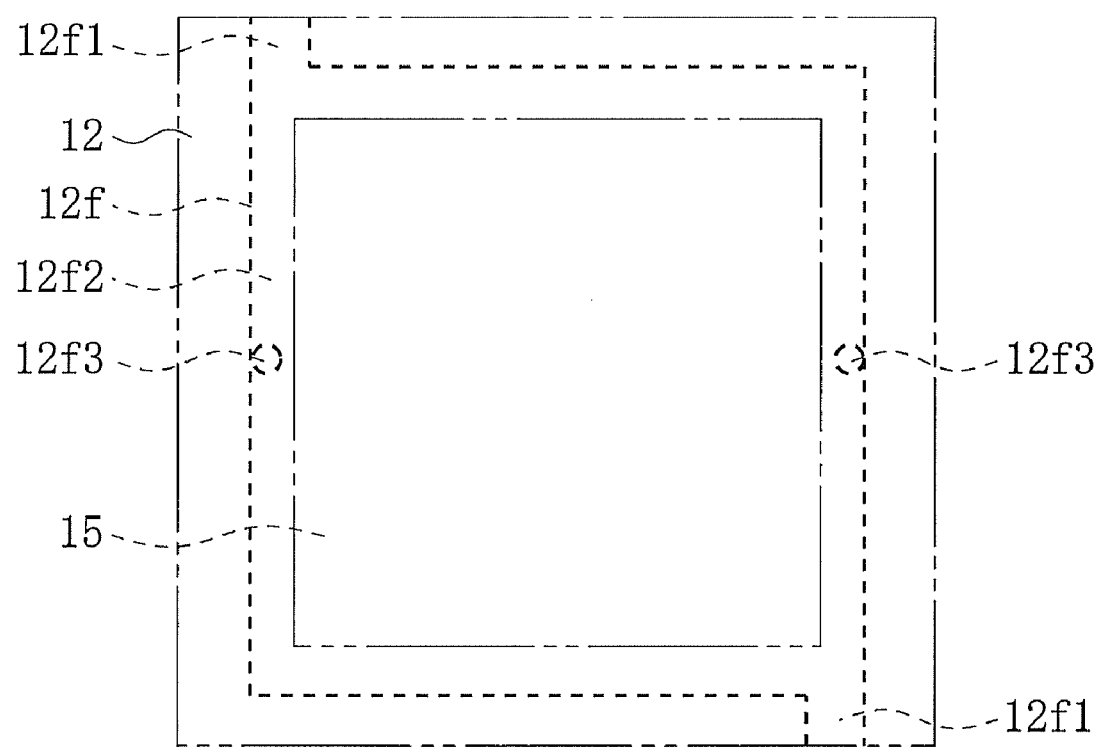
FIG. 6 is a view showing an aspect of a planar part shown in FIG. 5.

An aspect of the ground wiring 12f embedded in the first insulating portion 12, and in particular, a planar part 12f2 will be explained with reference to FIG. 6. As shown by the dashed lines in FIG. 6, the ground wiring 12f has the planar part 12f2 present between two wiring parts 12f1, and two via parts 12f3 disposed on the planar part 12f2 are connected to the core portion 11. In other words, the planar part 12f2 forms a portion of the ground wiring 12f. The outline of this planar part 12f2 is a substantially rectangular shape that is larger than the outline (see the two-dot chain line) of the mounting surface (lower surface) of the imaging device 15, and the planar part 12f2 is substantially parallel to the mounting surface (bottom surface) of the imaging device 15. Based on the size example, the thickness of the planar part 12f2 is the same as the wiring parts 12f1 and is in the range of 5 to 25 µm, for example, and the distance (depth) with the surface (top surface) of the first insulating portion 12 is in the range of 10 to 30 µm, for example. Due to the planar part 12f2 forming a portion of the ground wiring 12f, the Young's modulus (a modulus of longitudinal elasticity) of the planar part 12f2 is greater than the Young's modulus of the first insulating portion 12 (the portion made of a compound resin). This planar part 12f2 functions to mitigate deformation of the surface on which the imaging device 15 is mounted in the first insulating portion 12. FIG. 6 shows two of the via parts 12f3, but it is preferable that as many via parts 12f3 as possible be disposed on the planar part 12f2 and connected to the core portion 11.

(Effects of Camera Module in FIG. 5)

(E21) In the camera module shown in FIG. 5, the planar part 12f2, which is for mitigating deformation of the surface of the first insulating portion 12 on which the imaging device 15 is mounted, is embedded in the first insulating portion 12 of the substrate 10 so as to face the imaging device 15 mounted on the surface (top surface) of the first insulating portion 12. Accordingly, even if stress following a shock from being dropped, heated, or the like is exerted on the camera module substrate 10 in a mobile device such as a mobile phone or smartphone, especially if exerted on the surface of the first insulating portion 12 on which the imaging device 15 is mounted, deformations caused by this stress such as deflection and buckling of the surface of the first insulating portion 12 on which the imaging device 15 is mounted are mitigated by the planar part 12f2. Thus, deformations causing a shift in the optical axis with respect to the imaging device 15 and lenses 21a, and thereby leading to functional failures such as image deviation or image distortion, for example, can be avoided.

(E22) In the camera module shown in FIG. 5, the planar part 12f2 is substantially parallel to the mounting surface (bottom surface) of the imaging device 15, and the Young's modulus of the planar part 12f2 is greater than the Young's modulus of the first insulating portion 12 (the portion made of a compound resin). Accordingly, a deformation mitigating effect on the surface of the first insulating portion 12 on which the imaging device 15 is mounted is exhibited more precisely, and the functional failures described above can be avoided more reliably.

(E23) In the camera module shown in FIG. 5, the planar part 12f2 is made of the same conductive material as the ground wiring 12f, and the planar part 12f2 forms a portion of the ground wiring 12f. Accordingly, forming the planar part 12f2 does not incur additional costs because the planar part 12f2 can be formed simultaneously when the ground wiring 12f is patterned in the first insulating portion 12.

(Modification Examples of Planar Part)

Figure 7A:
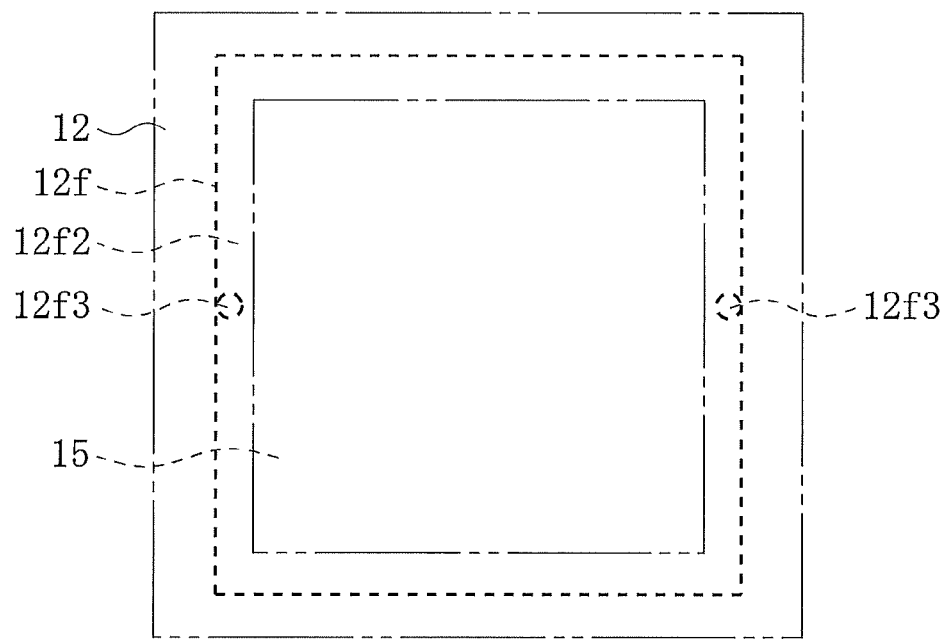
FIG. 7A is a view showing a modification example of the planar part shown in FIG. 5.

(M21) FIG. 6 showed the wiring parts 12f1 and via parts 12f3 together on the planar part 12f2, but as shown in FIG. 7A effects similar to the above-mentioned E21 to E23 can be achieved even if the wiring parts 12f1 are removed.

Figure 7B:
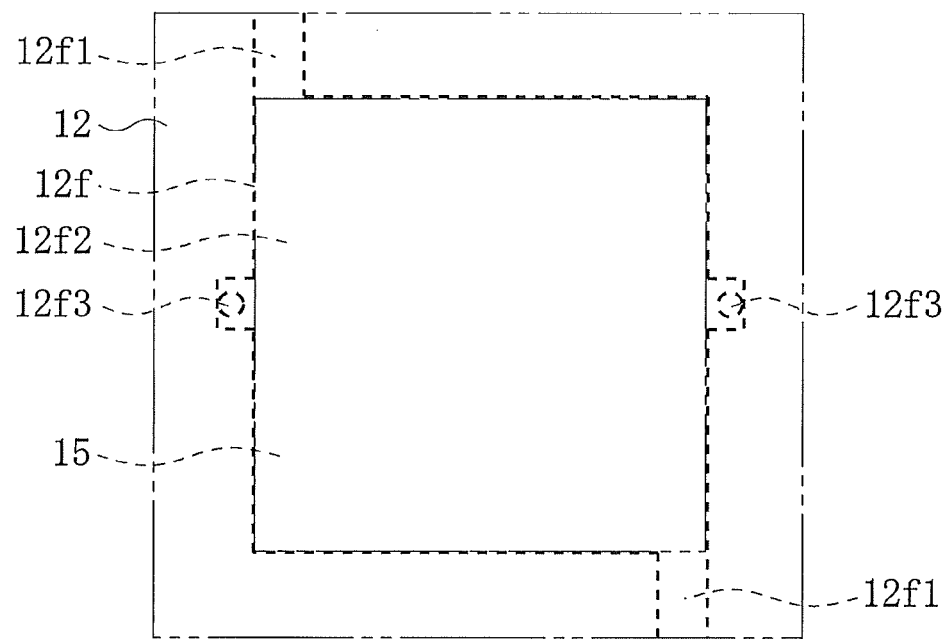
FIG. 7B is a view showing another modification example of the planar part shown in FIG. 7B.

(M22) FIG. 6 showed that the outline of the planar part 12f2 is larger than the outline of the mounting surface (bottom surface) of the imaging device 15, but as shown in FIG. 7B, effects similar to the above-mentioned E21 to E23 can be achieved even if the outline of the planar part 12f2 is substantially equal to the outline of the mounting surface (bottom surface) of the imaging device 15, and even if the outline of the planar part 12f2 shown in FIG. 7A is substantially equal to the outline of the mounting surface (bottom surface) of the imaging device 15. Needless to say, effects that are substantially similar to the above-mentioned E21 to E23 can be expected even if the outline of the planar part 12f2 is made slightly smaller than the outline of the mounting surface (bottom surface) of the imaging device 15.

Figure 8:
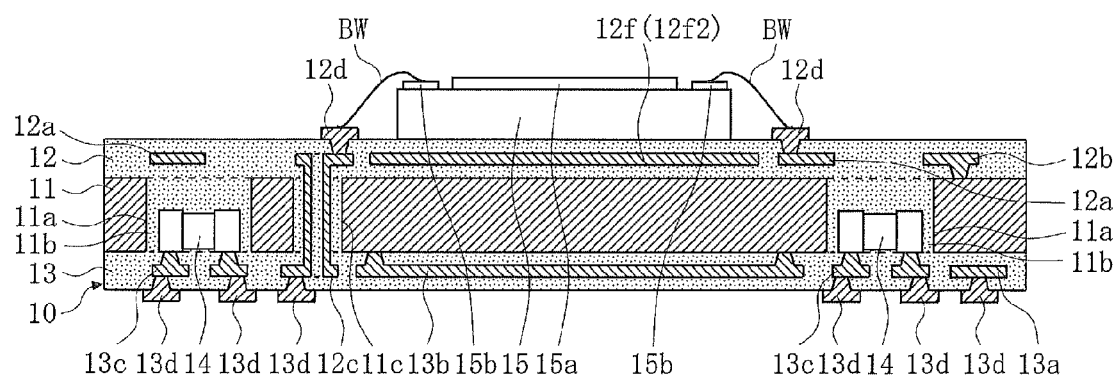
FIG. 8 is a view showing another modification example of the planar part shown in FIG. 5.

(M23) FIG. 6 showed that the planar part 12f2 was connected to the core portion 11 through the conductor vias 12f3, but as shown in FIG. 8 similar effects to the above-mentioned E21 to E23 can be achieved even if the conductor vias 12f3 are removed and even if the conductor vias 12f3 and the rectangular protruding portions are removed from the configuration shown in FIG. 7B. When these conductor vias 12f3 are removed, effects that are substantially similar to the above-mentioned E21 to E23 can be expected even if the outline of the planar part 12f2 is made slightly smaller than the outline of the mounting surface (bottom surface) of the imaging device 15.

(M24) Although such a drawing is omitted, effects similar to the above-mentioned E21 to E23 can be achieved even if just the planar part 12f2 in FIG. 6 excluding the wiring parts 12f1 and conductor vias 12f3, or in other words, even if just the planar part 12f2 without ground wiring is embedded. In addition, effects similar to the above-mentioned E21 to E23 can be achieved even if the outline of this planar part 12f2 is substantially equal to the outline of the mounting surface (bottom surface) of the imaging device 15, or in other words, even if the planar part 12f2 is arranged independently in a non-contact state with the ground wiring and the like embedded in the first insulating portion 12. When only this planar part 12f2 without ground wiring is embedded, effects that are substantially similar to the above-mentioned E21 to E23 can be expected even if the outline of the planar part 12f2 is made slightly smaller than the outline of the mounting surface (bottom surface) of the imaging device 15.

(M25) Although such a drawing is omitted, when only this planar part 12f2 without ground wiring as described in the above-mentioned M24 is embedded, the material of the planar part 12f2 does not necessarily have to be conductive. Effects similar to the above-mentioned E21 to E23 can be achieved even if an equivalent planar part made of a non-conductive material such as ceramic or glass that has a greater Young's modulus than the Young's modulus of the first insulating portion 12 (the compound resin portion) is embedded in the first insulating portion 12.

(M26) Although such a drawing is omitted, as long as deformation of the surface of the first insulating portion 12 on which the imaging device 15 is mounted can be mitigated, effects similar to the above-mentioned E21 to E23 can be achieved even if the planar part 12f2 shown in FIG. 6 and the planar part 12f2 described in the above-mentioned M21 to M25 have slits for passing signal wiring therethrough or though-holes for arranging conductor vias Other Modification Examples In FIGS. 5 and 8, a configuration in which the core portion 11 of the substrate 10 is made of a conductive material was shown, but effects similar to E21 to E23 can be achieved even if a configuration in which the core portion 11 is made of a non-conductive material such as a compound resin or ceramic is used, for example. Effects similar to the above-mentioned E21 to E23 can be achieved even if the core portion 11 and insulating material are made of a single layer-like insulating material, or in other words, even with a substrate structure in which the electronic components 14 are embedded in a single layer-like insulating material.

Embodiment 3 (FIGS. 9 to 12)

Figure 9:
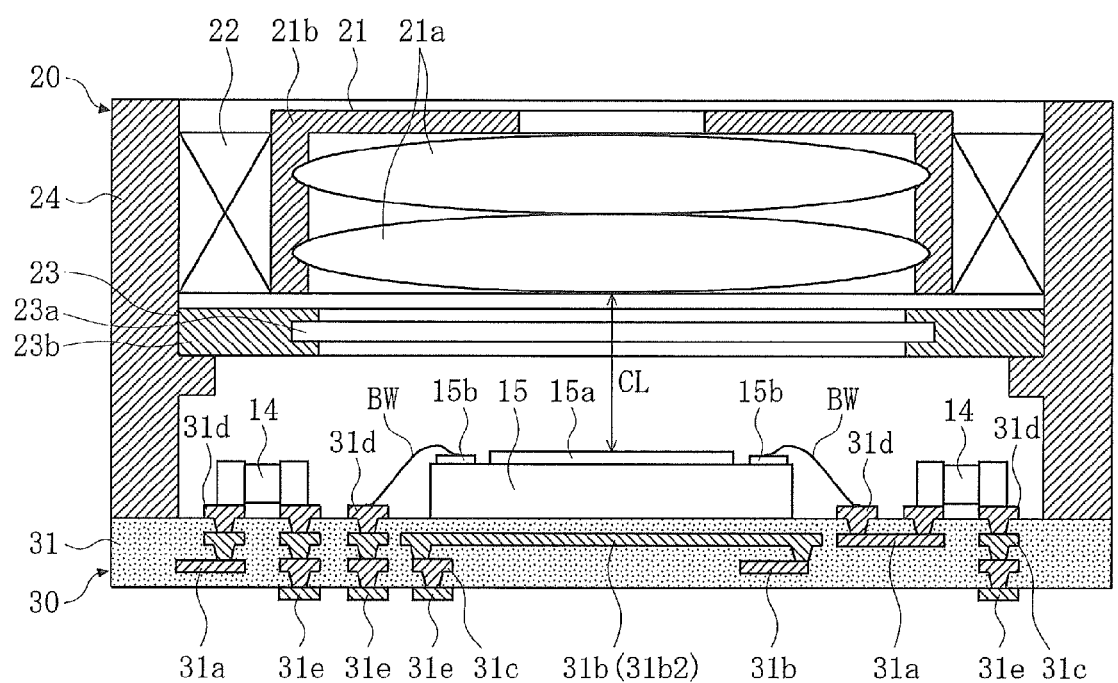
FIG. 9 is a vertical cross-sectional view showing a camera module according to Embodiment 3 of the present invention.

(Configuration of Camera Module in FIG. 9)

A camera module shown in FIG. 9 differs from the camera module of Embodiment 1 shown in FIG. 1 in that: the substrate 10 has been replaced with a multilayer structure substrate 30 with no electronic components 14 embedded therein; the electronic components 14 are mounted on conductor pads 31d disposed on the surface (top surface) of an insulating portion 31 on the substrate 30; an imaging device 15 is mounted on the surface (top surface) of the insulating portion 31 on the substrate 30; and ground wiring 31b has been embedded in the insulating portion 31 as a replacement for the ground wiring 13b shown in FIG. 1. For reference, a size example of the camera module shown in FIG. 9 has a length and width (the horizontal direction in FIG. 9) of approximately 8.5 mm, and a height (the vertical direction in FIG. 9) of approximately 7 mm.

As shown in FIG. 9, the substrate 30 has the electronic components 14 and imaging device 15 disposed on the surface side (top surface side) of the substrate 30, and the insulating portion 31 in which signal wiring 31a, ground wiring 31b, and the like are embedded. In other words, the substrate 30 is a multilayer structure substrate without the electronic components 14 embedded therein.

The signal wiring 31a and ground wiring 31b, which are two-dimensionally patterned, and conductor vias 31c that have a "T" shape in a cross-sectional view are embedded in the insulating portion 31. The "T" shape conductor pads 31d and conductor pads 31e are respectively disposed on the surface (both the top surface and bottom surface) of the insulating portion 31.

Based on FIG. 9, the insulating portion 31 is made of a synthetic resin such as one that includes a reinforced filler (besides a thermosetting material, it is possible to use a thermoplastic material) made of an epoxy resin, a polyimide, a bismaleimide-triazine resin, or silicon dioxide or the like added to these. The thickness of the insulating portion 31 is in the range of 50 to 150 μm, for example. The signal wiring 31a, ground wiring 31b, and the conductor vias 31d and 31e are made of a conductive material such as copper or a copper alloy, and the thickness of the signal wiring 31a and the ground wiring 31b is in the range of 5 to 25 μm, for example.

The terminals of the electronic component 14 on the left side are respectively connected to the first and second conductor pads 31d from the left through a jointing material such as solder, and the terminals of the electronic component 14 on the right side are respectively connected to the first and second conductor pads 31d from the right through a jointing material such as solder. The imaging device 15 is mounted to the surface (top surface) of the insulating portion 31 with an adhesive agent, and connection pads 15b on the imaging device 15 are connected to the third and fourth conductor pads 31d from the left through bonding wires BW.

The first conductor pad 31d from the left is connected to the signal wiring 31a in the insulating portion 31 through the conductor via 31c in the insulating portion 31. The second conductor pad 31d from the left is connected to the first conductor pad 31e from the left through the conductor via 31c in the insulating portion 31. The third conductor pad 31d from the left is connected to the second conductor pad 31e from the left through the conductor via 31c in the insulating portion 31. The first conductor pad 31d from the right is connected to the first conductor pad 31e from the right through the conductor via 31c in the insulating portion 31, and the second and third conductor pads 31d from the right are connected to the signal wiring 31a in the insulating portion 31. The ground wiring 31*b* in the insulating portion 31 is connected to the conductor via 31*c* in the insulating portion 31 through a via part 31*b*3 (see FIG. 10) of the ground wiring 31*b*. This conductor via 31*c* is connected to the third conductor pad 31*e* from the left, and is connected to another ground wiring 31*b* in the insulating portion 31 through another via part 31*b*3 (see FIG. 10).

Figure 10:
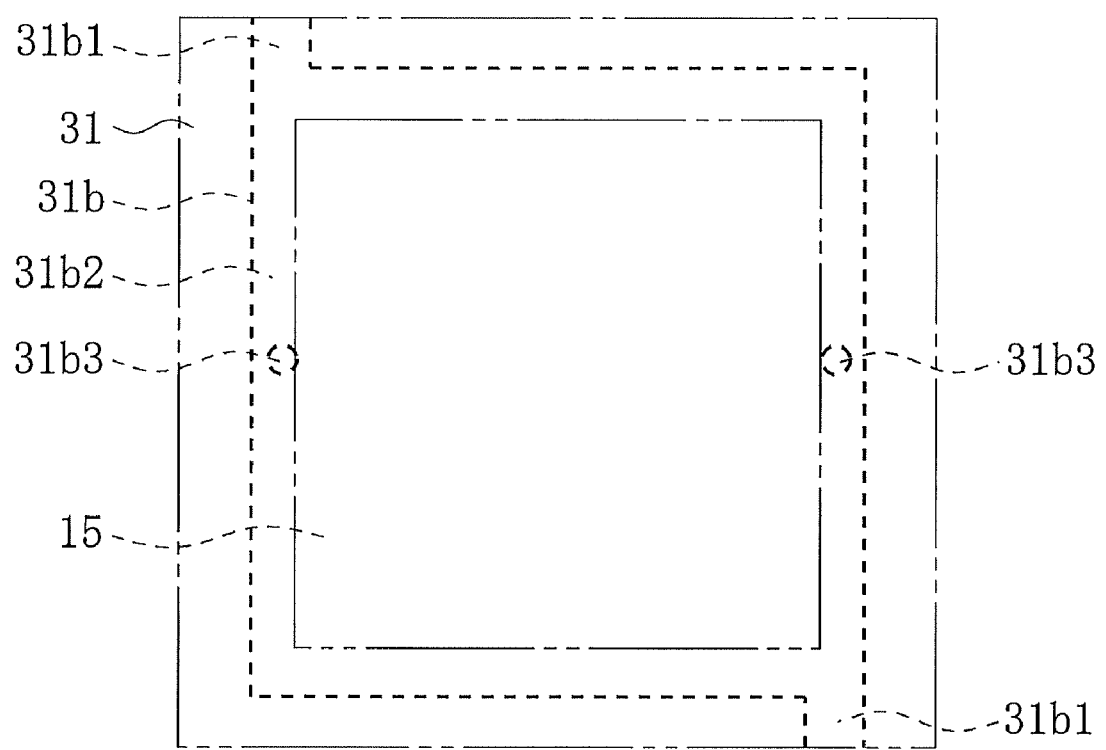
FIG. 10 is a view showing an aspect of a planar part shown in FIG. 9.

The ground wiring 31*b* embedded in the insulating portion 31, and in particular, an aspect of a planar part 31*b*2 will be explained with reference to FIG. 10. As shown by the dashed lines in FIG. 10, the ground wiring 31*b* has the planar part 31*b*2 present between two wiring parts 31*b*1, and two of the via parts 31*b*3 disposed on the planar part 31*b*2 are connected to conductor via 31*c* and the other ground wiring 31*b*. In other words, the planar part 31*b*2 forms a portion of the ground wiring 31*b*. The outline of this planar part 31*b*2 is a substantially rectangular shape that is larger than the outline (see the two-dot chain line) of the mounting surface (lower surface) of the imaging device 15, and the planar part 31*b*2 is substantially parallel to the mounting surface (bottom surface) of the imaging device 15. Based on the size example, the thickness of the planar part 31*b*2 is the same as the wiring parts 31*b*1 and in the range of 5 to 25 μm, for example, and the distance (depth) with the surface (top surface) of the insulating portion 31 is in the range of 10 to 30 μm, for example. Due to the planar part 31*b*2 forming a portion of the ground wiring 31*b*, the Young's modulus (a modulus of longitudinal elasticity) of the planar part 31*b*2 is greater than the Young's modulus of the insulating portion 31 (the portion made of a compound resin). This planar part 31*b*2 functions to mitigate deformation of the surface on which the imaging device 15 is mounted in the insulating portion 31. FIG. 10 shows two of the via parts 31*b*3, but it is preferable that as many via parts 31*b*3 as possible be disposed on the planar part 31*b*2 and connected to the conductor via 31*c* and other ground wiring 31*b*.

(Effects of Camera Module in FIG. 9)

(E31) In the camera module shown in FIG. 9, the planar part 31*b*2, which is for mitigating deformation of the surface of the insulating portion 31 on which the imaging device 15 is mounted, is embedded in the insulating portion 31 of the substrate 30 so as to face the imaging device 15 mounted on the surface (top surface) of the insulating portion 31. Accordingly, even if stress following a shock from being dropped, heated, or the like is exerted on the camera module substrate 30 in a mobile device such as a mobile phone or smartphone, especially if exerted on the surface of the insulating portion 31 on which the imaging device 15 is mounted, deformations caused by this stress such as deflection and buckling of the surface of the insulating portion 31 on which the imaging device 15 is mounted are mitigated by the planar part 31*b*2; thus, deformations causing a shift in the optical axis with respect to the imaging device 15 and lenses 21*a*, leading to functional failures such as image deviation or image distortion, for example, can be avoided.

(E32) In the camera module shown in FIG. 9, the planar part 31*b*2 is substantially parallel to the mounting surface (bottom surface) of the imaging device 15, and the Young's modulus of the planar part 31*b*2 is greater than the Young's modulus of the insulating portion 31 (the portion made of a compound resin). Accordingly, a deformation mitigating effect on the surface of the insulating portion 31 on which the imaging device 15 is mounted is exhibited more precisely, and the functional failures described above can be avoided more reliably.

(E33) In the camera module shown in FIG. 9, the planar part 31*b*2 is made of the same conductive material as the ground wiring 31*b*, and the planar part 31*b*2 forms a portion of the ground wiring 31*b*. Accordingly, forming the planar part 31*b*2 does not incur additional costs because the planar part 31*b*2 can be formed simultaneously when the ground wiring 31*b* is patterned in the insulating portion 31.

(Modification Examples of Planar Part)

Figure 11A:
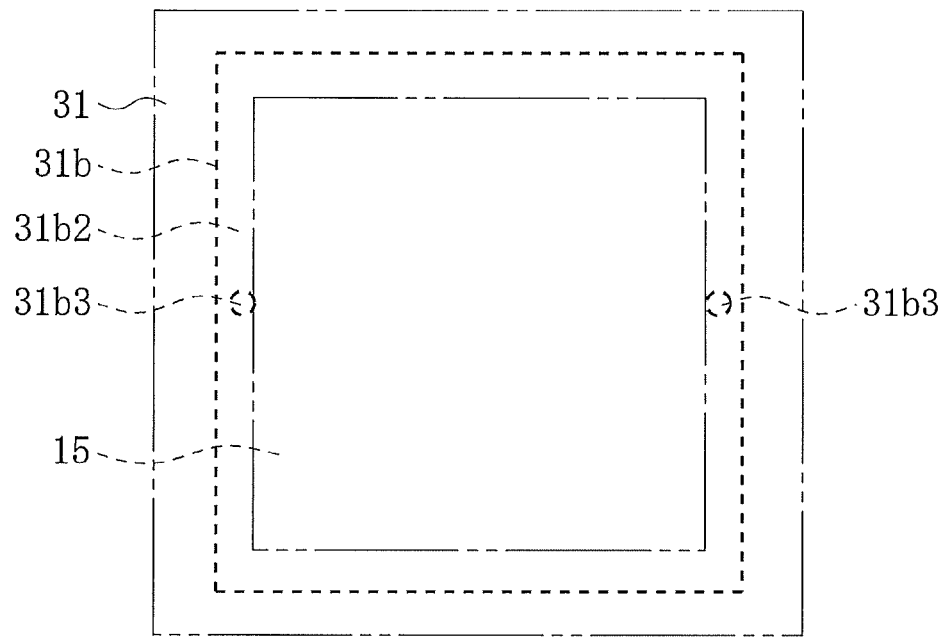
FIG. 11A is a view showing a modification example of the planar part shown in FIG. 9.

(M31) FIG. 10 showed the wiring parts 31*b*1 and via parts 31*b*3 together on the planar part 31*b*2, but as shown in FIG. 11A similar effects to the above-mentioned E31 to E33 can be achieved even if the wiring parts 31*b*1 are removed.

Figure 11B:
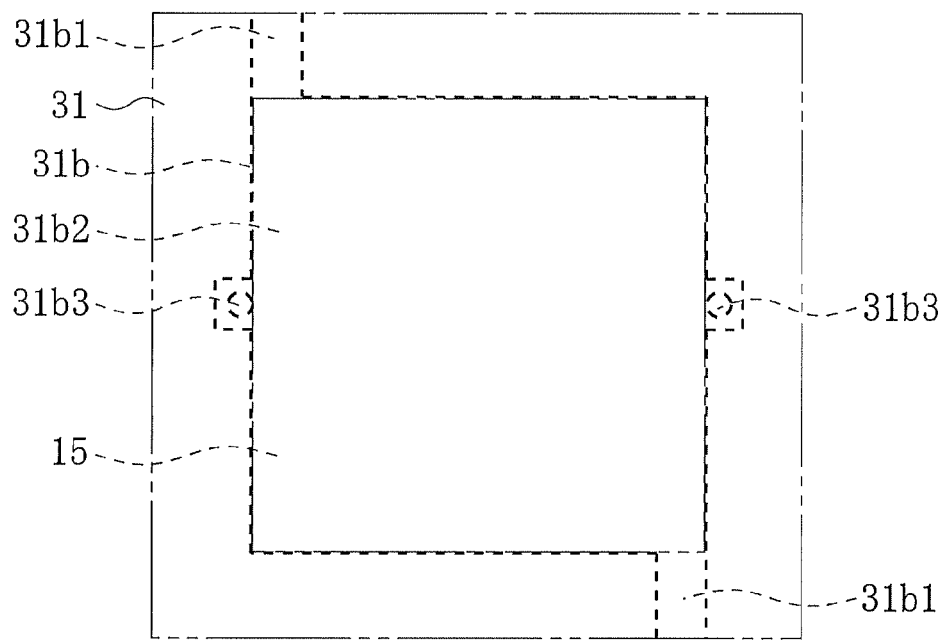
FIG. 11B is a view showing another modification example of the planar part shown in FIG. 9.

(M32) FIG. 10 showed that the outline of the planar part 31*b*2 is larger than the outline of the mounting surface (bottom surface) of the imaging device 15, but as shown in FIG. 11B, effects similar to the above-mentioned E31 to E33 can be achieved even if the outline of the planar part 31*b*2 is substantially equal to the outline of the mounting surface (bottom surface) of the imaging device 15, and even if the outline of the planar part 31*b*2 shown in FIG. 11A is substantially equal to the outline of the mounting surface (bottom surface) of the imaging device 15. Needless to say, effects that are substantially similar to the above-mentioned E31 to E33 can be expected even if the outline of the planar part 31*b*2 is made slightly smaller than the outline of the mounting surface (bottom surface) of the imaging device 15.

Figure 12:
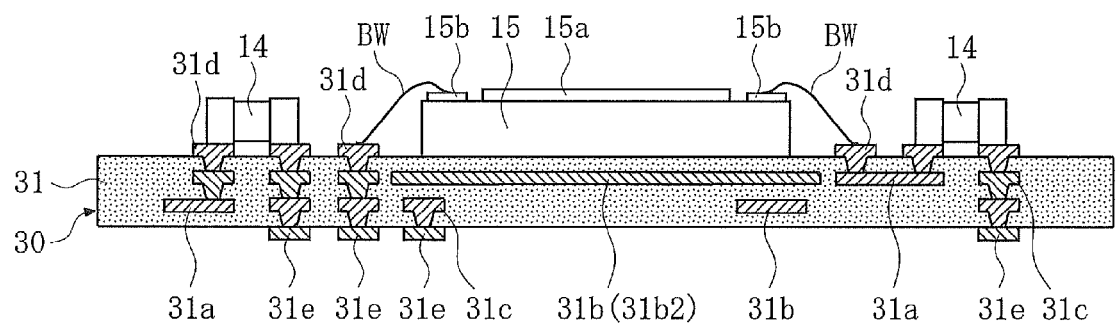
FIG. 12 is a view showing another modification example of the planar part shown in FIG. 9.

(M33) FIG. 10 showed that the planar part 31*b*2 was connected to the conductor via 31*c* and the other ground wiring 31*b* through the conductor vias 31*b*3, but as shown in FIG. 12, effects similar to the above-mentioned E31 to E33 can be achieved even if the conductor vias 31*b*3 are removed and even if the conductor vias 31*b*3 and the rectangular protruding portions are removed from the configuration shown in FIG. 11B. When these conductor vias 31*b*3 are removed, effects that are substantially similar to the above-mentioned E31 to E33 can be expected even if the outline of the planar part 31*b*2 is made slightly smaller than the outline of the mounting surface (bottom surface) of the imaging device 15.

(M34) Although such a drawing is omitted, effects similar to the above-mentioned E31 to E33 can be achieved even if just the planar part 31*b*2 in FIG. 10 excluding the wiring parts 31*b*1 and conductor vias 31*b*3 is embedded, or in other words, even if just the planar part 31*b*2 without ground wiring is embedded. In addition, effects similar to the above-mentioned E31 to E33 can be achieved even if the outline of this planar part 31*b*2 is substantially equal to the outline of the mounting surface (bottom surface) of the imaging device 15, or in other words, even if the planar part 31*b*2 is arranged independently in a non-contact state with the ground wiring and the like embedded in the insulating portion 31. When just this planar part 31*b*2 without ground wiring is embedded, effects that are substantially similar to the above-mentioned E31 to E33 can be expected even if the outline of the planar part 31*b*2 is made slightly smaller than the outline of the mounting surface (bottom surface) of the imaging device 15.

(M35) Although such a drawing is omitted, when only a planar part 31*b*2 without ground wiring as described in the above-mentioned M24 is embedded, the material of the planar part 31*b*2 does not necessarily have to be conductive. Effects similar to the above-mentioned E31 to E33 can be achieved even if an object with a Young's modulus higher than that of the insulating portion 31 (the compound resin portion) is embedded in the insulating portion 31.

(M36) Although such a drawing is omitted, as long as deformation of the surface of the insulating portion 31 on which the imaging device 15 is mounted can be mitigated, effects similar to the above-mentioned E31 to E33 can be achieved even if the planar part 31b2 shown in FIG. 10 and the planar part 31b2 described in the above-mentioned M31 to M35 have slits for passing signal wiring therethrough or though-holes for arranging conductor vias.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A camera module, comprising:
a multi-layered substrate including a core portion, a first insulating portion on a top surface of the core portion, and a second insulating portion on a bottom surface of the core portion, the first and second insulating portions having first and second wirings, respectively, embedded therein, a part of the first insulating portion and a part of the core portion thereunder having an opening to define a recessed portion bottomed by the second insulating portion that is exposed through the opening;
an imaging device mounted within the recessed portion of the substrate, the imaging device having a plurality of light capturing elements arranged two-dimensionally so as to capture two-dimensional images, the imaging device having a bottom surface an entirety of which is directly attached on the exposed second insulating portion of the substrate; and
a lens arranged over the substrate at a position above the imaging device,
wherein a planar board-shaped member is embedded in the second insulating portion of the substrate so as to face the imaging device, the planar board-shaped member having a shape larger than or substantially corresponding to said bottom surface of the imaging device such that the planar board-shaped member mitigates deformation of a surface of the board shape of the second insulating portion on which the imaging device is mounted.

2. The camera module according to claim 1, wherein the planar board-shaped member is substantially parallel to the bottom surface of the imaging device that is attached to the exposed second insulating portion.

3. The camera module according to claim 2,
wherein the planar board-shaped member is made of a conductive material, and
wherein the planar board-shaped member forms a portion of the second wiring that is embedded in the second insulating portion.

4. The camera module according to claim 2,
wherein the planar board-shaped member is made of a conductive material, and
wherein the planar board-shaped member is not in contact with the second wiring that is embedded in the second insulating portion.

5. The camera module according to claim 2,
wherein the planar board-shaped member is made of a non-conductive material, and
wherein the planar board-shaped member is not in contact with the second wiring that is embedded in the second insulating portion.

6. The camera module according to claim 1, wherein a Young's modulus of the planar board-shaped member is greater than a Young's modulus of the second insulating portion.

7. The camera module according to claim 6,
wherein the planar board-shaped member is made of a conductive material, and
wherein the planar board-shaped member forms a portion of the second wiring that is embedded in the second insulating portion.

8. The camera module according to claim 6,
wherein the planar board-shaped member is made of a conductive material, and
wherein the planar board-shaped member is not in contact with the second wiring that is embedded in the second insulating portion.

9. The camera module according to claim 6,
wherein the planar board-shaped member is made of a non-conductive material, and
wherein the planar board-shaped member is not in contact with the second wiring that is embedded in the second insulating portion.

10. The camera module according to claim 1,
wherein the planar board-shaped member is made of a conductive material, and
wherein the planar board-shaped member forms a portion of the second wiring that is embedded in the second insulating portion.

11. The camera module according to claim 1,
wherein the planar board-shaped member is made of a conductive material, and
wherein the planar board-shaped member is not in contact with the second wiring that is embedded in the second insulating portion.

12. The camera module according to claim 1,
wherein the planar board-shaped member is made of a non-conductive material, and
wherein the planar board-shaped member is not in contact with the second wiring that is embedded in the second insulating portion.

13. The camera module according to claim 1,
wherein the substrate further includes electronic components embedded therein in addition to said imaging device.

14. The camera module according to claim 1, wherein the core portion of the substrate has one or more through-holes that each house an electronic component with an insulating material filled in a gap between the electronic component and the through-hole.

* * * * *